(12) United States Patent
Wang et al.

(10) Patent No.: US 11,176,996 B2
(45) Date of Patent: Nov. 16, 2021

(54) RESISTIVE RANDOM ACCESS MEMORY AND RESETTING METHOD THEREOF

(71) Applicant: Winbond Electronics Corp., Taichung (TW)

(72) Inventors: Ping-Kun Wang, Taichung (TW);
Ming-Che Lin, Taichung (TW);
Yu-Ting Chen, Taichung (TW);
Chang-Tsung Pai, Taichung (TW);
Shao-Ching Liao, Taichung (TW);
Chi-Ching Liu, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/930,469

(22) Filed: May 13, 2020

(65) Prior Publication Data
US 2021/0012839 A1 Jan. 14, 2021

(30) Foreign Application Priority Data

Jul. 9, 2019 (TW) ................. 108124117

(51) Int. Cl.
*G11C 13/00* (2006.01)
*H01L 27/24* (2006.01)
*H01L 45/00* (2006.01)

(52) U.S. Cl.
CPC ...... *G11C 13/0097* (2013.01); *G11C 13/0007* (2013.01); *G11C 13/0061* (2013.01); *G11C 13/0064* (2013.01); *H01L 27/2436* (2013.01); *H01L 45/08* (2013.01); *H01L 45/1246* (2013.01); *H01L 45/1253* (2013.01); *H01L 45/146* (2013.01); *G11C 2213/32* (2013.01);

(Continued)

(58) Field of Classification Search
CPC ............ G11C 13/0097; G11C 13/0007; G11C 13/0061; G11C 13/0064; G11C 2213/79; G11C 2213/32; G11C 2213/51; G11C 13/003; H01L 27/2436; H01L 45/08; H01L 45/1246; H01L 45/1253; H01L 45/146

See application file for complete search history.

(56) References Cited

U.S. PATENT DOCUMENTS

| 9,361,980 B1 | 6/2016 | Tsai et al. |
| 2010/0038791 A1 | 2/2010 | Lee et al. |
| 2013/0214236 A1 | 8/2013 | Lu et al. |

(Continued)

FOREIGN PATENT DOCUMENTS

| CN | 101621114 | 1/2010 |
| CN | 103222055 | 7/2013 |
| CN | 105789207 | 7/2016 |

*Primary Examiner* — Tri M Hoang
(74) *Attorney, Agent, or Firm* — JCIPRNET

(57) ABSTRACT

Provided is a resistive random access memory (RRAM) including at least one memory cell. The at least one memory cell includes a top electrode, a bottom electrode, a data storage layer, an oxygen gettering layer, a first barrier layer, and an oxygen supplying layer. The data storage layer is disposed between the top electrode and the bottom electrode. The oxygen gettering layer is disposed between the data storage layer and the top electrode. The first barrier layer is disposed between the oxygen gettering layer and the data storage layer. The oxygen supplying layer is disposed between the oxygen gettering layer and the top electrode and/or between the oxygen gettering layer and the first barrier layer.

12 Claims, 8 Drawing Sheets

(52) U.S. Cl.
CPC ...... *G11C 2213/51* (2013.01); *G11C 2213/79* (2013.01)

(56) References Cited

U.S. PATENT DOCUMENTS

| | | |
|---|---|---|
| 2015/0188039 A1 | 7/2015 | Wang et al. |
| 2015/0372228 A1* | 12/2015 | Chiang .................. H01L 45/12 257/2 |
| 2016/0260898 A1 | 9/2016 | Lai et al. |
| 2017/0170394 A1* | 6/2017 | Chen .................... H01L 45/085 |
| 2017/0279041 A1* | 9/2017 | Chen .................... H01L 45/1233 |
| 2018/0375024 A1* | 12/2018 | Chu .................... H01L 45/1246 |

* cited by examiner

RESISTIVE RANDOM ACCESS MEMORY AND RESETTING METHOD THEREOF

CROSS-REFERENCE TO RELATED APPLICATION

This application claims the priority benefit of Taiwan application serial no. 108124117, filed on Jul. 9, 2019. The entirety of the above-mentioned patent application is hereby incorporated by reference herein and made a part of this specification.

BACKGROUND OF THE INVENTION

Field of the Invention

The present invention relates to a memory and a resetting method thereof, and in particular to a resistive random access memory and a resetting method thereof.

Description of Related Art

Resistive random access memory (RRAM) is a non-volatile memory. RRAM is able to memorize or store data by using the change of the resistance state. RRAM is very compatible with the integrated circuit manufacturing process.

In RRAM, the three operations of forming, setting and resetting are three important steps to ensure the electrical characteristics and data retention of RRAM. However, the possibility of RRAM failure after multiple operations will increase. For example, when an excessively high voltage is used for the resetting operation, it may cause the resistive memory cell that should be in a low current state to increase its current instead. This phenomenon is called a complementary switching (CS) phenomenon, which is a unique phenomenon in the field of RRAM.

When the CS phenomenon occurs in the resistive memory cell, the high resistance state (HRS) and low resistance state (LRS) of the resistive memory cell will become difficult to distinguish. That is to say, this resistive memory cell will lose the memory ability. Therefore, how to provide an RRAM and a resetting method thereof to reduce the complementary switching phenomenon of the resistive memory cell, thereby extending the endurance of RRAM will become an important subject.

SUMMARY OF THE INVENTION

The invention provides a resistive random access memory (RRAM) and a resetting method thereof, which is able to reduce the complementary switching phenomenon of the resistive memory cell, thereby extending the endurance of the RRAM.

The invention provides a resistive random access memory including at least one memory cell. The at least one memory cell includes a top electrode, a bottom electrode, a data storage layer, an oxygen gettering layer, a first barrier layer, and an oxygen supplying layer. The data storage layer is disposed between the top electrode and the bottom electrode. The oxygen gettering layer is disposed between the data storage layer and the top electrode. The first barrier layer is disposed between the oxygen gettering layer and the data storage layer. The oxygen supplying layer is disposed between the oxygen gettering layer and the top electrode and/or between the oxygen gettering layer and the first barrier layer.

The invention provides a resetting method of a resistive random access memory including performing a reset loop on at least one resistive memory cell, which comprises: performing a first resetting operation on the at least one resistive memory cell, and performing a first verifying operation on the at least one resistive memory cell after the first resetting operation is finished; determining whether to perform a second resetting operation on the at least one resistive memory cell according to a verifying result of the first verifying operation, and performing a second verifying operation on the at least one resistive memory cell after the second resetting operation is determined to be performed and is finished; and determining whether to perform a healing resetting operation on the at least one resistive memory cell according to a verifying result of the second verifying operation, which comprises: performing the healing resetting operation on the at least one resistive memory cell when a verifying current of the second verifying operation is greater than a predetermined current, wherein a resetting voltage of the healing resetting operation is greater than a resetting voltage of the second resetting operation.

Based on the above, in the embodiment of the present invention, the oxygen supplying layer is disposed between the oxygen gettering layer and the upper electrode and/or between the oxygen gettering layer and the first barrier layer to continuously supply oxygen ions or oxygen atoms to the data storage layer during the resetting operation. In the case, the complementary switching (CS) phenomenon due to the excessively high resetting voltage can be avoided. In addition, in the embodiment of the present invention, the healing resetting operation may be performed on the RRAM to further reduce the probability of complementary switching phenomenon, thereby extending the endurance of the RRAM.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
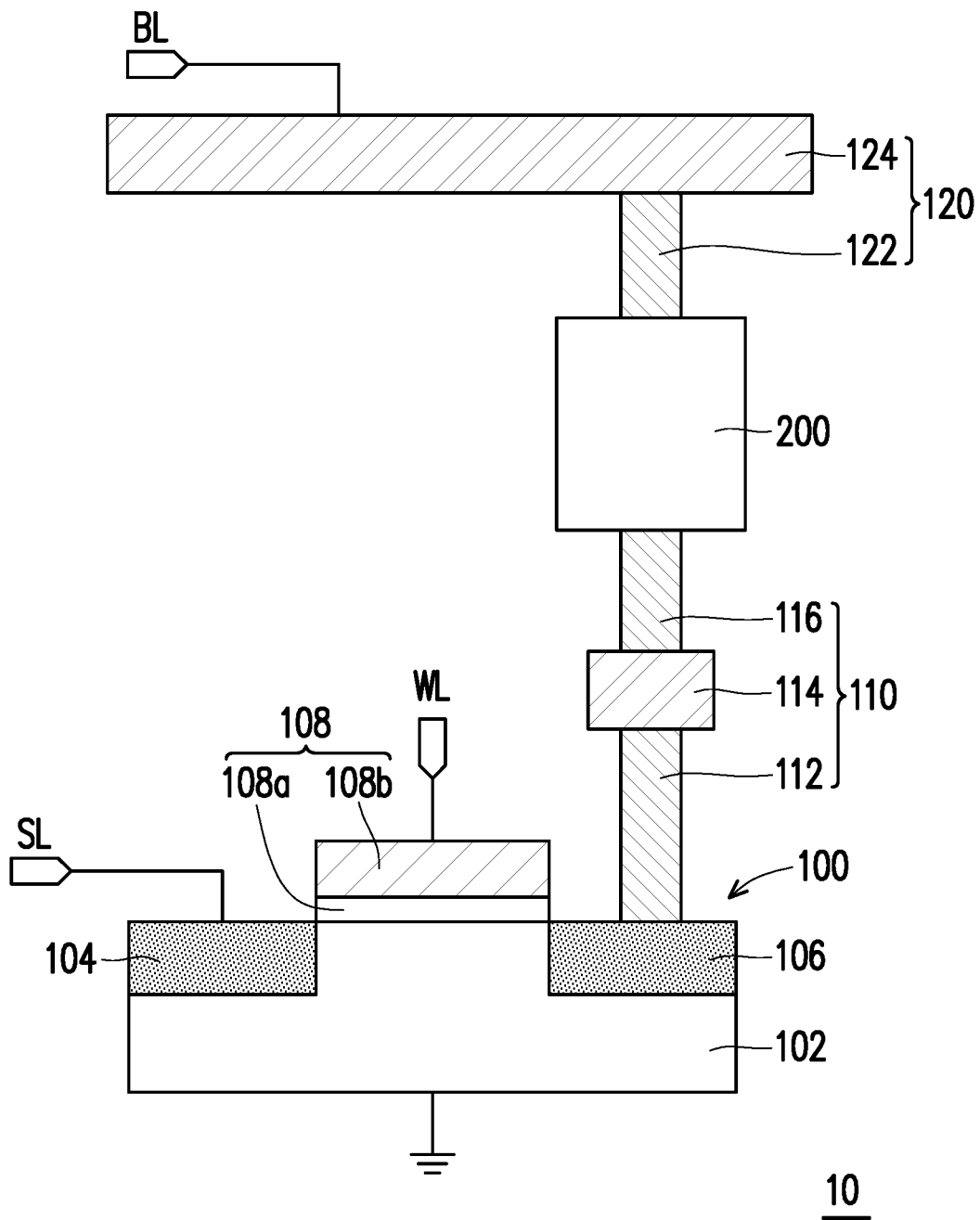
FIG. 1 is a schematic cross-sectional view of a resistive random access memory (RRAM) according to an embodiment of the invention.

The invention is more blanketly described with reference to the figures of the present embodiments. However, the invention can also be implemented in various different forms, and is not limited to the embodiments in the present specification. The thicknesses of the layers and regions in the figures are enlarged for clarity. The same or similar reference numerals represent the same or similar devices and are not repeated in the following paragraphs.

Referring to FIG. 1, in an embodiment of the invention, a resistive random access memory (RRAM) 10 includes a transistor 100 and at least one memory cell 200. Specifically, the transistor 100 includes a substrate 102, a source 104, a drain 106, and a gate structure 108. The gate structure 108 is disposed on the substrate 102 and electrically connected to a word line WL. The gate structure 108 includes a gate dielectric layer 108a and a gate 108b located on the gate dielectric layer 108a.

The source 104 and the drain 106 are respectively disposed in the substrate 102 on both sides of the gate structure 108. The source 104 is electrically connected to a source line SL, and the drain 106 is electrically connected to the memory cell 200.

As shown in FIG. 1, the memory cell 200 is disposed on the transistor 100. One end of the memory cell 200 is electrically connected to the drain 106 of the transistor 100 through a first interconnect 110, and another end of the memory cell 200 is electrically connected to the bit line BL through a second interconnect 120. Although FIG. 1 only shows one memory cell 200, the invention is not limited thereto. In other embodiments, the number of memory cells 200 may be increased to a plurality of memory cells according to needs, and the plurality of memory cells 200 may be arranged in a memory cell array.

In detail, the first interconnect 110 may include vias 112 and 116 and a conductive line layer 114 between the vias 112 and 116. The via 112 is electrically coupled to or in direct contact with the drain 106; and the via 116 is electrically coupled to or in direct contact with the lower electrode of the memory cell 200. In some embodiments, a material of the vias 112 and 116 and a material of the conductive line layer 114 may include a metal material, a barrier metal material, a combination thereof, or other suitable conductive materials. The vias 112, 116 and the conductive line layer 114 may have the same material or different materials. The second interconnect 120 may include a via 122 and a conductive line layer 124 on the via 122. The via 122 is electrically coupled to or in direct contact with the upper electrode of the memory cell 200. In another embodiment, a material of the via 122 and a material of the conductive line layer 124 may include a metal material, a barrier metal material, a combination thereof, or other suitable conductive materials. The via 122 and the conductive line layer 124 may have the same material or different materials. Although the memory cell 200 illustrated in FIG. 1 is located between the conductive line layer 114 (i.e., the first metal layer, metal-1) and the conductive line layer 124 (i.e., the second metal layer, metal-2), the invention is not limited thereto. In other embodiments, the memory cell 200 may be located between any two metal layers in the back-end-of-line (BEOL), at the same level with any metal layer, or at the same level with any via.

Figure 2A:
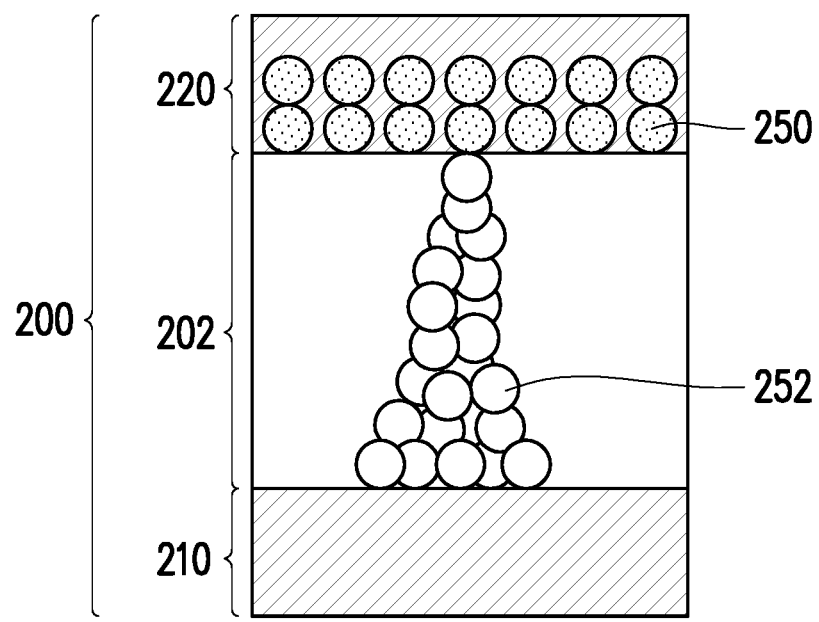
FIG. 2A to FIG. 2D are schematic views respectively illustrating a set phenomenon, a reset phenomenon, a reset deep phenomenon, and a complementary switching (CS) phenomenon of a RRAM memory cell according to another embodiment of the present invention.
Figure 2B:
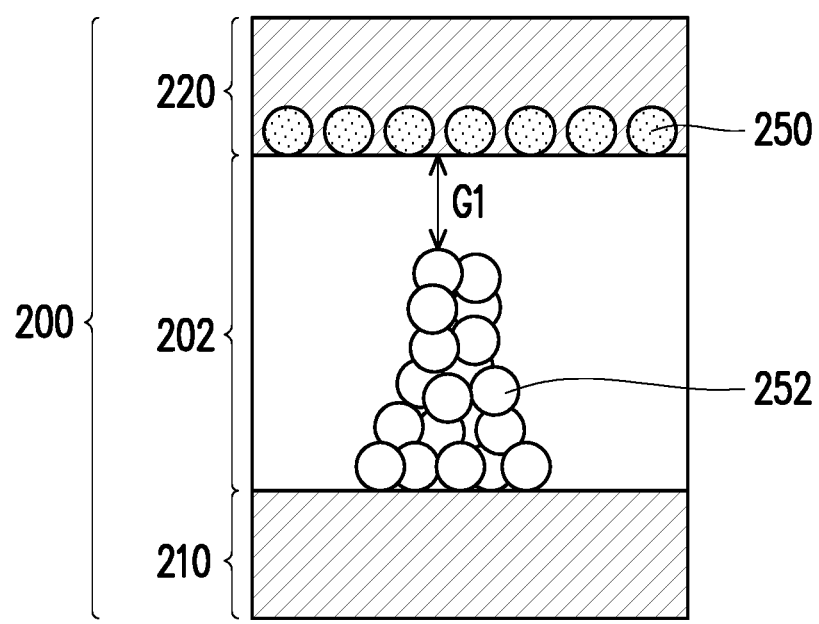

In order to simplify the description, only the lower electrode 210, the upper electrode 220, and the data storage layer 202 between the lower electrode 210 and the upper electrode 220 are shown in FIG. 2A to FIG. 2D. Other unillustrated components are shown in FIG. 3A to FIG. 3C.

In some embodiments, the memory cell 200 has at least two resistance states. The memory cell 200 is able to change the resistance state of the memory cell 200 by applying different voltages across the electrodes to provide the function of storing data. Specifically, before performing operations on the memory cell 200, a forming procedure needs to be performed first. That is, a higher positive bias voltage (i.e., a forming voltage) is applied to the memory cell 200 to generate an external electric field to the data storage layer 202. The said external electric field will ionize oxygen atoms into oxygen ions 250 and oxygen vacancies 252, thereby forming a filament as a current transmission path. In the case, the memory cell 200 has a low resistance state (LRS), as shown in FIG. 2A.

During the resetting operation, a negative bias voltage (i.e., a resetting voltage) is applied to the memory cell 200, so that the filament is disconnected. Specifically, the oxygen ions 250 of the upper electrode 220 are combined with the oxygen vacancies 252 adjacent to the upper electrode 220, so that the filament is disconnected from the adjacent upper electrode 220 and separated by a gap G1. In the case, the memory cell 200 changes from a low resistance state to a high resistance state (HRS), as shown in FIG. 2B.

Figure 2C:
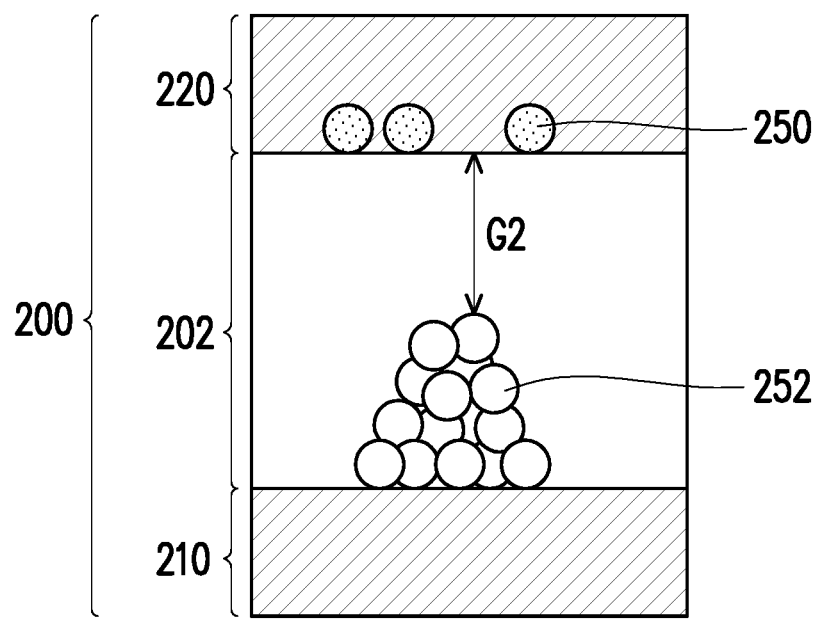
Figure 3A:
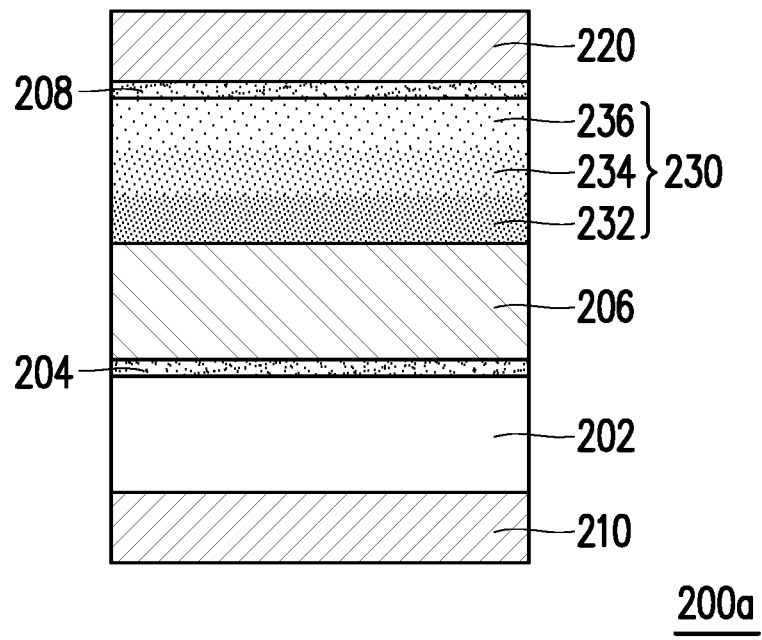
FIG. 3A is a schematic cross-sectional view of a RRAM memory cell according to the first embodiment of the invention.
Figure 3B:
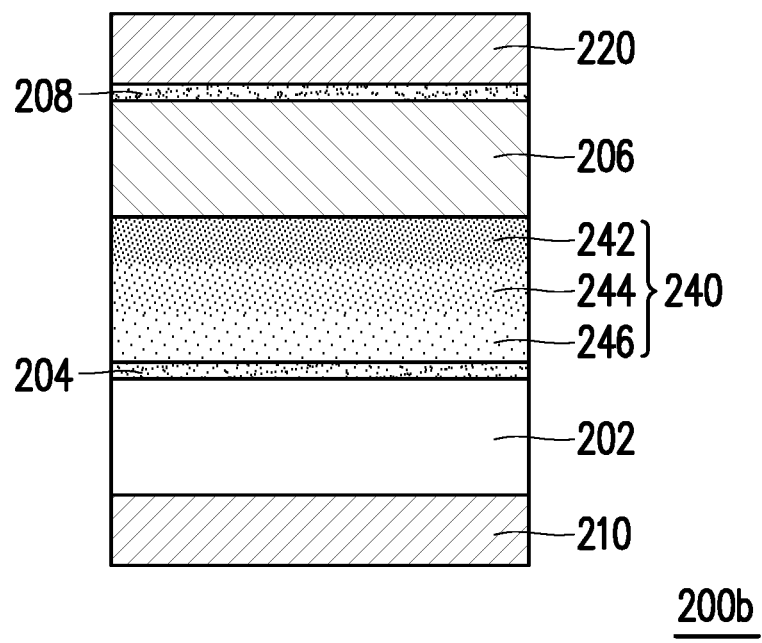
FIG. 3B is a schematic cross-sectional view of a RRAM memory cell according to a second embodiment of the invention.
Figure 3C:
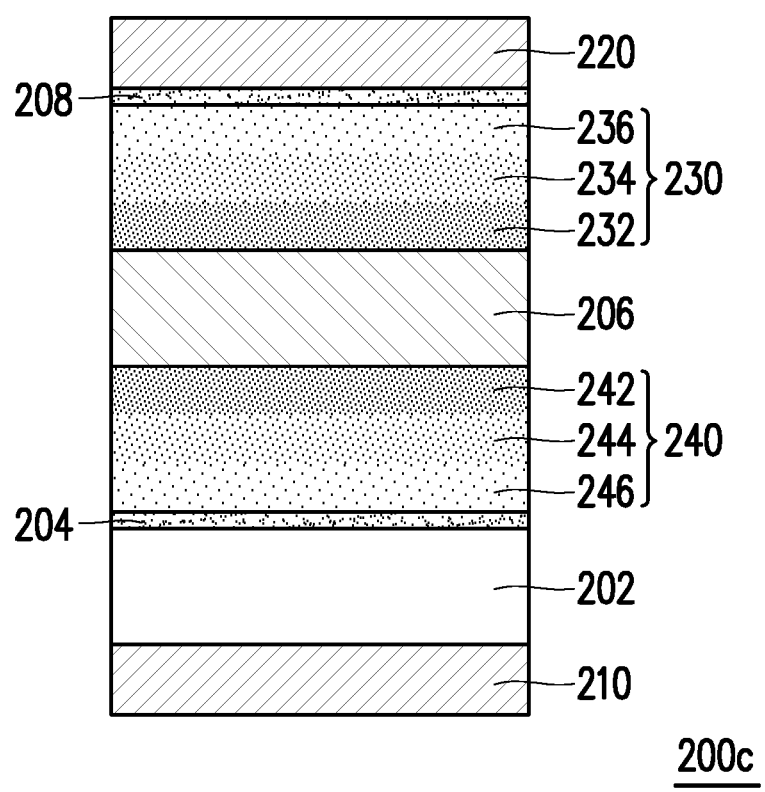
FIG. 3C is a schematic cross-sectional view of a RRAM memory cell according to a third embodiment of the invention.

During the deep resetting operation, that is, a greater negative bias voltage is applied to the memory cell 200, and more oxygen ions 250 are combined with the oxygen vacancies 252, so that a gap G2 between the filament and the upper electrode 220 is greater, thereby increasing the resistance value of the memory cell 200, as shown in FIG. 2C. In the case, the oxygen ions 250 of the upper electrode 220 decreases as the resetting voltage increases.

Figure 2D:
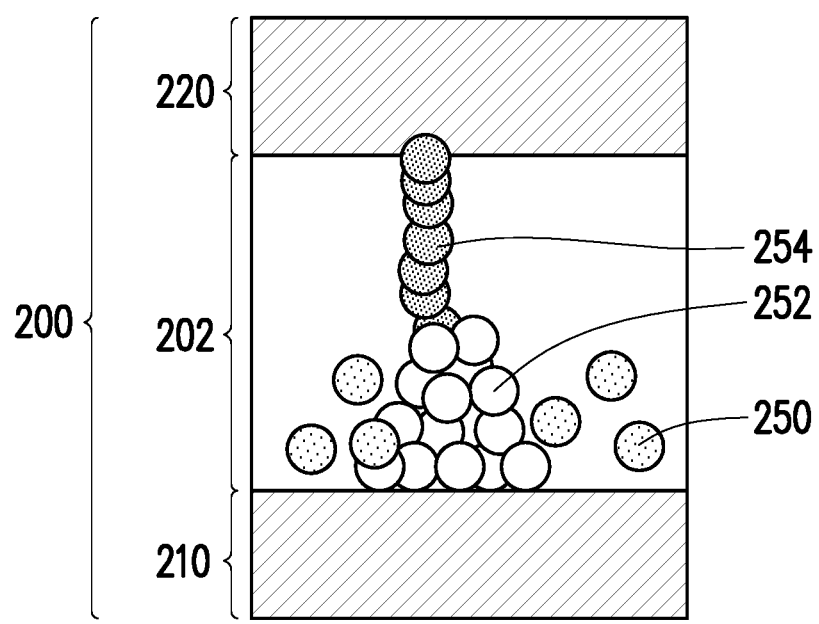

In some embodiments, when an excessively high voltage is used to perform a resetting operation such that the external electric field exceeds a threshold value, the data storage layer 202 may cause a dielectric breakdown, thereby changing from a high resistance state to a low resistance state. In other words, the upper electrode 220 can no longer provide oxygen ions 250 to combine with the oxygen vacancies 252, so that the external electric field traverses the data storage layer 202, thereby generating unnecessary filaments 254, as shown in FIG. 2D. In the case, the current of the memory cell 200 does not decrease but increases (or the resistance does not increase but decreases). The situation may be referred to as a complementary switching (CS) phenomenon, which causes the high-resistance state (i.e., the digital signal "0") and the low-resistance state (i.e., the digital signal "1") of the memory cell 200 difficult to distinguish, thereby losing the memory ability.

On the other hand, after the normal resetting operation, the setting operation may be performed. In other words, a positive bias voltage (i.e., a setting voltage) is applied to the memory cell 200 to re-ionize the oxygen atoms in the data storage layer 202 into the oxygen ions 250 and the oxygen vacancies 252, and the filament is re-formed. In the case, the memory cell 200 changes from the high resistance state to the low resistance state again, as shown in FIG. 2A.

Based on the above, the embodiment of the present invention provides various RRAM memory cell structures to reduce the complementary switching (CS) phenomenon of the memory cell 200. For details, please refer to the following paragraphs.

Specifically, as shown in FIG. 3A, a memory cell 200a includes: a lower electrode 210, an upper electrode 220, a data storage layer 202, a first barrier layer 204, an oxygen gettering layer 206, an oxygen supplying layer 230, and a second barrier layer 208. The data storage layer 202 is disposed between the lower electrode 210 and the upper electrode 220. In an embodiment, a material of the upper electrode 210 and a material of the lower electrode 220 respectively include a conductive material, which may be, for example, a metal material, a metal nitride, or other suitable conductive materials. The metal material includes at least one selected from the group consisting of Ti, Ta, Ni, Cu, W, Hf, Zr, Nb, Y, Zn, Co, Al, Si, and Ge. The metal nitride includes a nitride formed by at least one metal selected from the group consisting of Ti, Ta, Ni, Cu, W, Hf, Zr, Nb, Y, Zn, Co, Al, Si, and Ge. For example, the upper electrode 210 and the lower electrode 220 may be TiN layers, for example. In alternative embodiments, a material of the data storage layer 202 includes at least one oxide material selected from the group consisting of $TiO_2$, NiO, HfO, $HfO_2$, ZrO, $ZrO_2$, $Ta_2O_5$, ZnO, $WO_3$, CoO, and $Nb_2O_5$. For example, the data storage layer 202 may be an $HfO_2$ layer, and a thickness of the data storage layer 202 may be 5 nm to 10 nm. However, the present invention is not limited thereto, in other embodiments, the material of the data storage layer 202 is a variable resistance material that can change its own resistance through the applied voltage.

As shown in FIG. 3A, the oxygen gettering layer 206 is disposed between the data storage layer 202 and the upper electrode 220. In some embodiments, a material of the oxygen gettering layer 206 may include suitable metal materials, such as Ti, Ta, Hf, Zr, Al, or a combination thereof. For example, the oxygen gettering layer 206 may be a Ti layer, and a thickness of the oxygen gettering layer 206 may be 20 nm to 40 nm. In alternative embodiments, the oxygen gettering layer 206 has an ability of absorbing or binding the oxygen ions greater than that of the data storage layer 202, so as to quickly adsorb or bind oxygen ions during operating the memory cell 200a, thereby forming the filament in the data storage layer 202.

The first barrier layer 204 is disposed between the oxygen gettering layer 206 and the data storage layer 202 to serve as an oxygen diffusion barrier layer. Specifically, the first barrier layer 204 can prevent the oxygen ions from diffusing from the oxygen gettering layer 206 into the data storage layer 202 and then recombine with the oxygen vacancies in the data storage layer 202, thereby avoiding the high-temperature data retention (HTDR) fail issue. In some embodiments, a material of the first barrier layer 204 includes suitable insulating materials or dielectric materials, such as aluminum oxide ($Al_2O_3$), silicon nitride, silicon carbide, silicon carbonitride, or a combination thereof. A thickness of the first barrier layer 204 may be 0.3 nm to 2 nm. However, the present invention is not limited thereto, in other embodiments, a work function of the first barrier layer 204 may be greater than that of the oxygen gettering layer 206, and the first barrier layer 204 and the oxygen gettering layer 206 may have different materials.

The second barrier layer 208 is disposed between the oxygen gettering layer 206 (or oxygen supplying layer 230) and the upper electrode 220 to serve as an oxygen diffusion barrier layer. Specifically, the second barrier layer 208 can prevent the oxygen ions from diffusing from the oxygen gettering layer 206 (or oxygen supplying layer 230) into the upper electrode 220, and cannot be returned to the data storage layer 202 again, thereby avoiding the device fail issue. In some embodiments, a material of the second barrier layer 208 includes suitable insulating materials or dielectric materials, such as aluminum oxide ($Al_2O_3$), silicon nitride, silicon carbide, silicon carbonitride, or a combination thereof, and a thickness of the second barrier layer 208 may be 0.3 nm to 2 nm. However, the present invention is not limited thereto, in other embodiments, a work function of the second barrier layer 208 may be greater than that of the oxygen supplying layer 230, and the second barrier layer 208 and the oxygen supplying layer 230 may have different materials. In alternative embodiments, the first barrier layer 204 and the second barrier layer 208 may have the same material or different materials.

The oxygen supplying layer 230 is disposed between the oxygen gettering layer 206 and the second barrier layer 208 to continuously supply oxygen ions or oxygen atoms to the oxygen gettering layer 206 during the resetting operation. In the case, the complementary switching (CS) phenomenon caused by the excessively high resetting voltage of the data storage layer 202 can be avoided. In some embodiments, a material of the oxygen supplying layer 230 includes TiO, TaO, NiO, WO, HfO, or a combination thereof. For example, the oxygen supplying layer 230 may be a TiO layer, for example. In alternative embodiments, an oxygen content of the oxygen supplying layer 230 is greater than that of the oxygen gettering layer 206.

Specifically, the oxygen supplying layer 230 includes a first region 232, a second region 236, and a third region 234. The first region 232 is in direct contact with the oxygen gettering layer 206; the second region 236 is in direct contact with the second barrier layer 208; and the third zone 234 is located between the first zone 232 and the second zone 236. In some embodiments, an oxygen content of the first region 232 is greater than an oxygen content of the third region 234; and the oxygen content of the third region 234 is greater than an oxygen content of the second region 236. In another embodiment, the oxygen content of the oxygen supplying layer 230 decreases along a direction from close to the oxygen gettering layer 206 to away from the oxygen gettering layer 206. In other words, the oxygen content of the oxygen supplying layer 230 is gradually changed in a gradient distribution.

It should be noted that the first region 232 with more oxygen content can directly supply a large amount of oxygen ions or oxygen atoms to the oxygen gettering layer 206 to avoid the complementary switching (CS) phenomenon. The second region 236 with less oxygen content can maintain the resistance value of the entire oxygen supplying layer 230 without affecting the operating voltage of the memory cell 200a. In some embodiments, the oxygen content of the first region 232 may be between 60.3 wt % and 73.7 wt %, such as about 67%; the oxygen content of the third region 234 may be between 45 wt % and 55 wt %, such as about 50 wt %; the oxygen content of the second region 236 may be between 20.7 wt % and 25.3 wt %, such as about 23 wt %. In alternative embodiments, a ratio of the oxygen content of the first region 232 to the oxygen content of the second region 236 may be between 2.4 and 3.6, such as about 3. Although the oxygen supplying layer 230 shown in FIG. 3A is divided into three regions, the invention is not limited thereto. In other embodiments, the oxygen supplying layer 230 may include two or more regions according to design requirements, such as four regions, five regions, and six regions.

Referring to FIG. 3B, a RRAM memory cell 200b of the second embodiment is similar to the RRAM memory cell 200a of the first embodiment. The main difference between the above two is that an oxygen supplying layer 240 of the RRAM memory cell 200b is disposed between the oxygen gettering layer 206 and the first barrier layer 204. Specifically, the oxygen supplying layer 240 includes a first region 242, a second region 246, and a third region 244. The first region 242 is in direct contact with the oxygen gettering layer 206; the second region 246 is in direct contact with the first barrier layer 204; and the third region 244 is located between the first region 242 and the second region 246. In some embodiments, an oxygen content of the first region 242 is greater than an oxygen content of the third region 244; and the oxygen content of the third region 244 is greater than an oxygen content of the second region 246. In another embodiment, the oxygen content of the oxygen supplying layer 240 decreases along a direction from close to the oxygen gettering layer 206 to away from the oxygen gettering layer 206. In other words, the oxygen content of the oxygen supplying layer 240 is gradually changed in a gradient distribution.

In the embodiment, the composition ratio of the oxygen supplying layer 240 is similar to the composition ratio of the oxygen supplying layer 230, which will not be repeated here. It should be noted that the second region 246 of the oxygen supplying layer 240 is close to the data storage layer 202. To a certain extent, the second region 246 with less oxygen content may be used as the oxygen gettering layer 206 to quickly adsorb or bind oxygen ions during operating the memory cell 200b, thereby forming filaments in the data storage layer 202. In the case, the second region 246 of the oxygen supplying layer 240 may have an ability of absorbing or binding the oxygen ions greater than that of the data storage layer 202.

Referring to FIG. 3C, a RRAM memory cell 200c of the third embodiment is a combination of the oxygen supplying layer 230 of the RRAM memory cell 200a and the oxygen supplying layer 240 of the RRAM memory cell 200b. In other words, the RRAM memory cell 200c includes the oxygen supplying layer 230 (also referred to as a first oxygen supplying layer) disposed between the oxygen gettering layer 206 and the second barrier layer 208, and the oxygen supplying layer 240 (also referred to as a second oxygen supplying layer) disposed between the oxygen gettering layer 206 and the first barrier layer 204. The oxygen gettering layer 206 is sandwiched between the oxygen supplying layer 230 and the oxygen supplying layer 240. In some embodiments, as shown in FIG. 3C, the oxygen content of the oxygen supplying layer 230 and the oxygen content of the oxygen supplying layer 240 decrease along a direction from close to the oxygen gettering layer 206 to away from the oxygen gettering layer 206.

In addition to the RRAM memory cells 200a, 200b, and 200c provided in the above embodiments can reduce the complementary switching (CS) phenomenon of the memory cell 200, the embodiment of the present invention can further reduce the probability of complementary switching phenomenon by a healing resetting operation, thereby extending the endurance of RRAM. Please refer to the following paragraphs for details.

Figure 4:
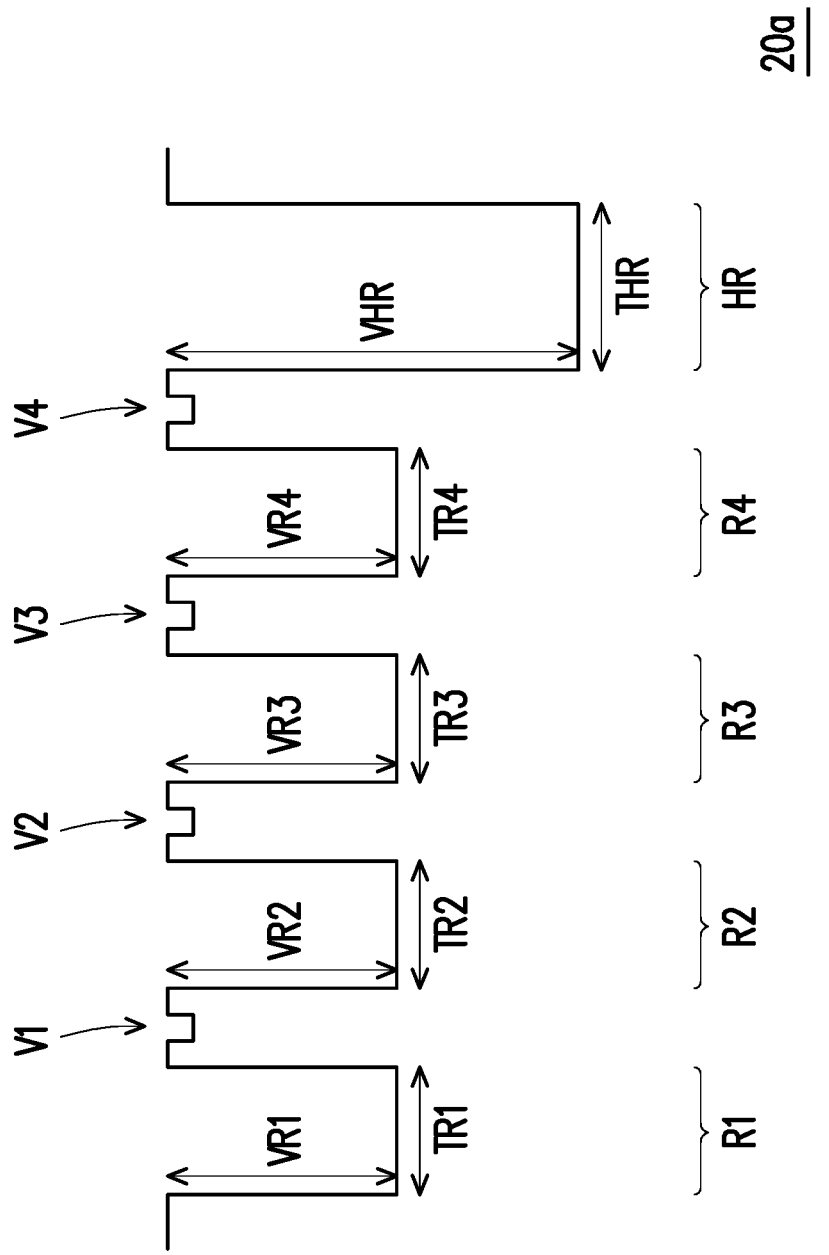
FIG. 4 is a schematic diagram illustrating a waveform in a resetting operation for a resistive memory cell according to a fourth embodiment of the invention.

Referring to FIG. 4, a reset loop 20a is performed on the resistive memory cell. In some embodiments, the above-mentioned resistive memory cell may be any one of the memory cells 200a, 200b, 200c, and the invention is not limited thereto. Specifically, first, a first resetting voltage VR1 is provided to connect across two ends of the resistive memory cell (e.g., upper electrode and lower electrode), and a first resetting operation R1 is performed on the resistive memory cell. After the first resetting operation R1 is finished, a first verifying operation V1 is performed on the resistive memory cell. Then, it is determined whether to perform a second resetting operation R2 on the resistive memory cell according to a verifying result of the first verifying operation V1. In detail, the first verifying operation V1 includes providing a verifying voltage to connect across the two ends of the resistive memory cell, and measuring a verifying current generated by the resistive memory cell according to the said verifying voltage. Next, it is determined whether the verifying current of the first verifying operation V1 is greater than a predetermined current (or a threshold current) to generate the verifying result of the first verifying operation V1. When the verifying current generated by the first verifying operation V1 is less than or equal to the above-mentioned predetermined current (or threshold current), it means that the resetting operation of this resistive memory cell has been finished and no subsequent second resetting operation R2 is required to be performed. On the contrary, if the verifying current generated by the first verifying operation V1 is greater than the above-mentioned predetermined current (or threshold current), it means that the resetting operation of the resistive memory cell has not been finished, and the subsequent second resetting operation R2 is still required. In some embodiments, the verifying voltage of the first verifying operation V1 is less than the first resetting voltage VR1 of the first resetting operation R1.

When the verifying result of the first verifying operation V1 indicates that the resetting operation of the resistive memory cell is not finished, the second resetting operation R2 may be performed on the resistive memory cell. That is, a second resetting voltage VR2 is provided to across the two ends of the resistive memory cell, and the second resetting operation R2 is performed for the resistive memory cell. After the second resetting operation R2 is finished, a second verifying operation V2 is performed on the resistive memory cell. Then, it is determined whether to perform a third resetting operation R3, a fourth resetting operation R4, or a healing resetting operation HR on the resistive memory cell according to the verifying result of the second verifying operation V2. In other words, although FIG. 4 illustrates four resetting operations R1, R2, R3, R4 and four verifying operations V1, V2, V3, V4, the invention is not limited thereto. In other embodiments, the number of resetting operations may be determined according to actual needs. For example, before the end of the total operation time of sites of the resetting operation, one or more resetting operations and corresponding number of verify operations may be performed to finish the resetting operation of the resistive memory cell. In some embodiments, the verifying voltages of the second verifying operation V2, the third verifying operation V3, and the fourth verifying operation V4 are respectively less than the second resetting voltage VR2 of the second resetting operation R2, and the third resetting voltage VR3 of the third resetting operation R3, and the fourth resetting voltage VR4 of the fourth resetting operation R4.

As shown in FIG. 4, when the verifying result of the fourth verifying operation V4 indicates that the resetting operation of the resistive memory cell is not finished, a healing resetting operation HR may be performed on the resistive memory cell to end the reset loop 20a. Specifically, a healing resetting voltage VHR is provided to connect the two ends of the resistive memory cell, and a healing resetting operation HR is performed on the resistive memory cell. In detail, the fourth verifying operation V4 may verify the current value of the resistive memory cell after finishing the fourth resetting operation R4, and when the verifying current generated by the fourth verifying operation V4 is less than or equal to a predetermined current (or a threshold current), which indicates that the resetting operation of this resistive memory cell has been finished, and no subsequent healing resetting operation HR is required. On the contrary, if the verifying current generated by the fourth verifying operation V4 is greater than the predetermined current (or threshold current), it means that the resetting operation of this resistive memory cell has not been finished, and the subsequent healing resetting operation HR is required. In some embodiments, the healing resetting voltage VHR and the healing resetting time THR of the healing resetting operation HR are greater than the resetting voltage VR1, VR2, VR3, VR4 and the resetting time TR1, TR2, TR3, TR4 of the resetting operation R1, R2, R3, R4, respectively. It should be noted that, in the embodiment, a larger healing resetting voltage can more strongly supply oxygen ions or oxygen atoms in the oxygen supplying layer to the data storage layer, so as to more effectively reduce the occurrence of the complementary switching phenomenon. Therefore, the present embodiment can not only continuously supplement the oxygen ions or oxygen atoms to the data storage layer through the oxygen supplying layer during the resetting operation, but also reduce the complementary switching phenomenon more effectively by the healing resetting operation.

Figure 5:
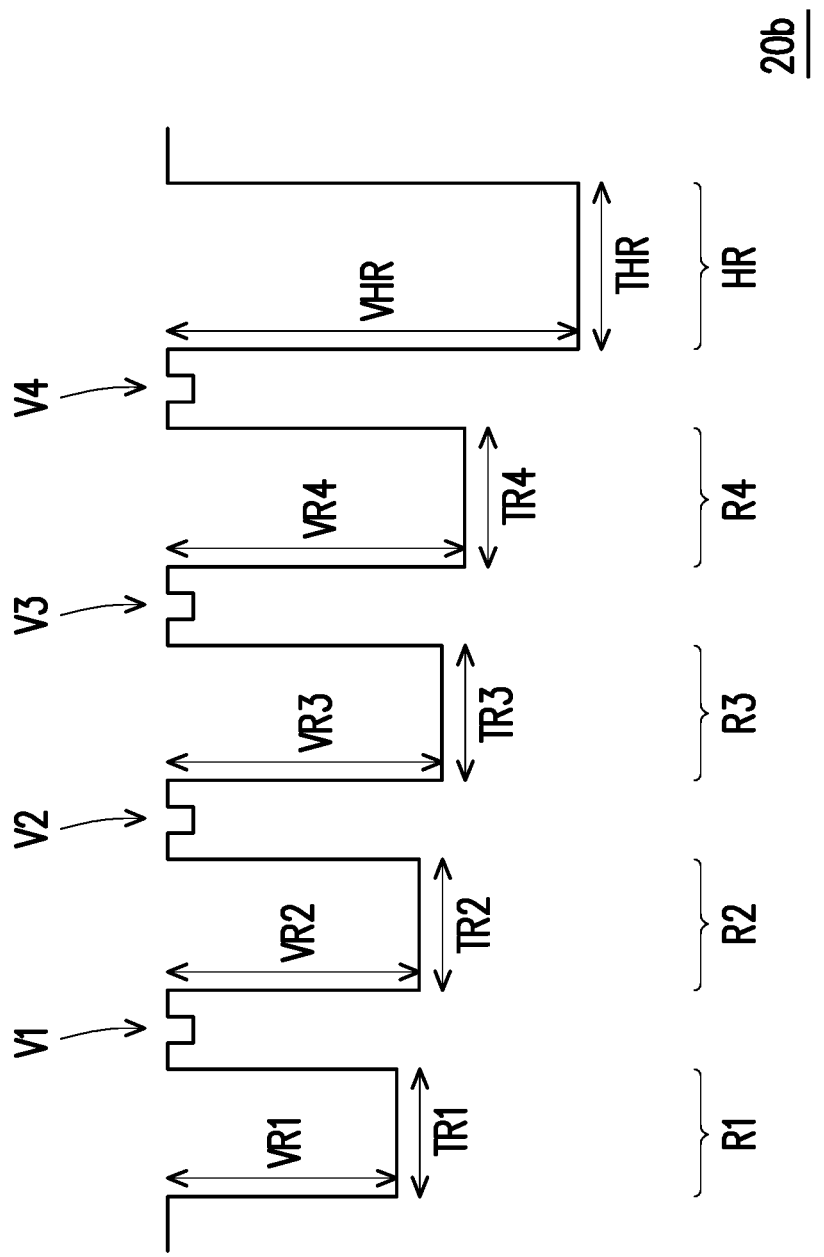
FIG. 5 is a schematic diagram illustrating a waveform in a resetting operation for a resistive memory cell according to the fifth embodiment of the invention.

Basically, the schematic diagram of the waveform illustrated in FIG. 5 is similar to that in FIG. 4. The main difference between the above two is that the reset voltage VR1, VR2, VR3, VR4 of the resetting operation R1, R2, R3, R4 in the reset loop 20b of FIG. 5 may increase as the number of resetting operation increases; while the reset voltages VR1, VR2, VR3, and VR4 of resetting operations R1, R2, R3, and R4 in the reset loop 20a of FIG. 4 are substantially the same to each other. In addition, the reset time TR1, TR2, TR3, TR4 of the resetting operation R1, R2, R3, R4 in the reset loop 20b of FIG. 5 may also increase as the number of resetting operation increases; while the resetting times R1, R2, R3, and R4 in the reset loop 20a of FIG. 4 are substantially the same to each other.

Figure 6:
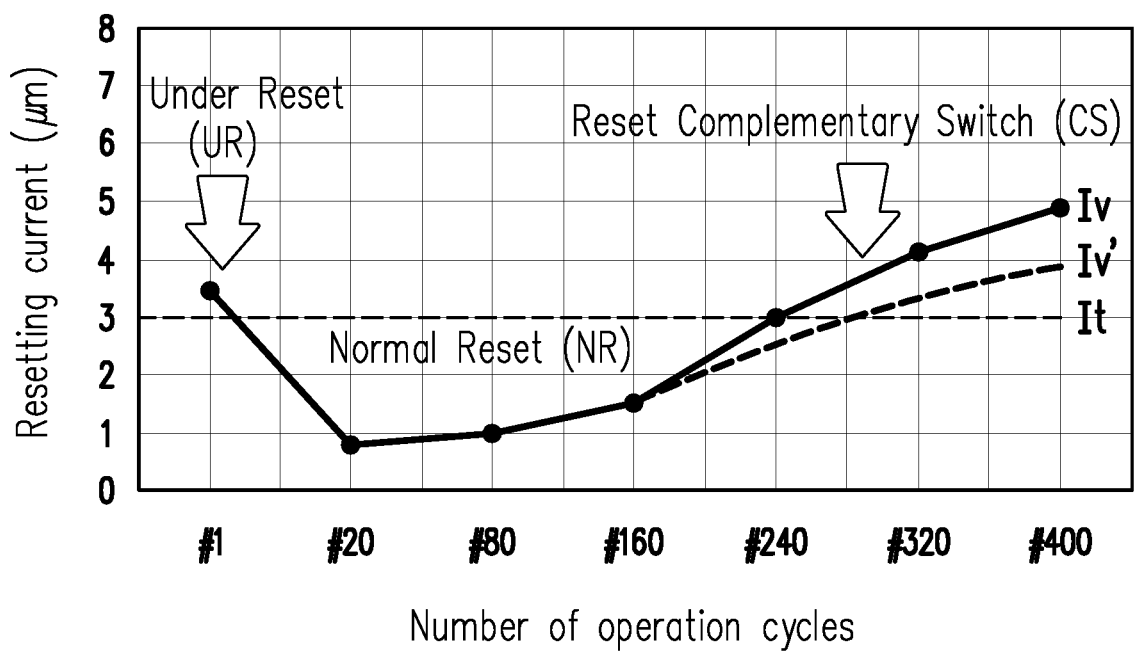
FIG. 6 is a graph showing a relationship between a resetting current and the number of operation cycles of a resistive memory cell according to other embodiments of the invention.

Please refer to FIG. 6, in the beginning, the resistive memory cell is located in a under reset region UR. Before the number of operating cycles of the resistive memory cell is less than 240 (the number of operating cycles may vary with design requirements), the verifying current Iv of the resistive memory cell is less than the threshold current It. That is, the resistive memory cell at this time is in a normal reset region NR. As the number of operation cycles of the resistive memory cell increases, the physical state of the resistive memory cell will change from the normal reset state to the reset complementary switch region CS. In other words, the verifying current Iv of the resistive memory cell at this time will be greater than the threshold current It, and the resetting operation cannot be finished. In the case, in the present embodiment, the verifying current curve Iv may be changed to the verifying current curve Iv' by the oxygen supplying layer and/or by the healing resetting operation, so as to increase the number of operating cycles of the resistive memory cell under the normal reset state, thereby extending the endurance of resistive memory cells.

In summary, in the embodiment of the present invention, the oxygen supplying layer is disposed between the oxygen gettering layer and the upper electrode and/or between the oxygen gettering layer and the first barrier layer to continuously supply oxygen ions or oxygen atoms to the data storage layer during the resetting operation. In the case, the complementary switching (CS) phenomenon due to the excessively high resetting voltage can be avoided. In addition, in the embodiment of the present invention, the healing resetting operation may be performed on the RRAM to further reduce the probability of complementary switching phenomenon, thereby extending the endurance of the RRAM.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A resistive random access memory (RRAM), comprising at least one memory cell, the at least one memory cell comprising:
   a data storage layer, disposed between an upper electrode and a lower electrode;
   an oxygen gettering layer, disposed between the data storage layer and the upper electrode;
   a first barrier layer, disposed between the oxygen gettering layer and the data storage layer;
   a first oxygen supplying layer, disposed between the oxygen gettering layer and the upper electrode; and
   a second barrier layer disposed between the first oxygen supplying layer and the upper electrode to be in contact with the first oxygen supplying layer and the upper electrode.

2. The RRAM according to claim 1, wherein an oxygen content of the first oxygen supplying layer decreases along a direction from close to the oxygen gettering layer to away from the oxygen gettering layer.

3. The RRAM according to claim 1, wherein the first oxygen supplying layer comprises:
   a first region directly contacting the oxygen gettering layer;
   a second region directly contacting the second barrier layer; and
   a third region located between the first region and the second region, and an oxygen content of the first region greater than an oxygen content of the second region.

4. The RRAM according to claim 1, further comprising a second oxygen supplying layer disposed between the oxygen gettering layer and the first barrier layer, and the oxygen gettering layer is disposed between the first oxygen supplying layer and the second oxygen supplying layer.

5. The RRAM according to claim 4, wherein a material of the first oxygen supplying layer or the second oxygen supplying layer comprises TiO, TaO, NiO, WO, HfO, or a combination thereof.

6. The RRAM according to claim 4, wherein an oxygen content of the first oxygen supplying layer or the second oxygen supplying layer is greater than an oxygen content of the oxygen gettering layer.

7. The RRAM according to claim 4, wherein the second oxygen supplying layer comprises:
   a first region directly contacting the oxygen gettering layer;
   a second region directly contacting the first barrier layer; and a third region located between the first region and the second region, and an oxygen content of the first region greater than an oxygen content of the second region.

8. The RRAM according to claim 1, further comprising:
a transistor comprising a gate structure electrically connected to a word line, and a source and a drain located on both sides of the gate structure, wherein the source is electrically connected to a source line;
a first interconnect, electrically connected to the lower electrode of the at least one memory cell and the drain of the transistor; and
a second interconnect, electrically connected to the upper electrode of the at least one memory cell and a bit line.

9. A resistive random access memory (RRAM), comprising at least one memory cell, the at least one memory cell comprising:
a data storage layer, disposed between an upper electrode and a lower electrode;
an oxygen gettering layer, disposed between the data storage layer and the upper electrode;
a first barrier layer, disposed between the oxygen gettering layer and the data storage layer;
an oxygen supplying layer, disposed between the oxygen gettering layer and the first barrier layer; and
a second barrier layer disposed between the oxygen gettering layer and the upper electrode to be in contact with the oxygen gettering layer and the upper electrode.

10. The RRAM according to claim 9, wherein an oxygen content of the oxygen supplying layer decreases along a direction from close to the oxygen gettering layer to away from the oxygen gettering layer.

11. The RRAM according to claim 9, wherein a material of the oxygen supplying layer comprises TiO, TaO, NiO, WO, HfO, or a combination thereof.

12. The RRAM according to claim 9, wherein the oxygen supplying layer comprises:
a first region directly contacting the oxygen gettering layer;
a second region directly contacting the first barrier layer; and
a third region located between the first region and the second region, and an oxygen content of the first region greater than an oxygen content of the second region.

* * * * *